United States Patent [19]

Nieveen van Dijkum et al.

[11] Patent Number: 4,546,371
[45] Date of Patent: Oct. 8, 1985

[54] SEMICONDUCTOR DEVICE HAVING AN IMPROVED DUAL-GATE FIELD EFFECT TRANSISTOR

[75] Inventors: Adalbertus H. J. Nieveen van Dijkum; Robbert C. Thuis; Paul Zandveld, all of Nijmegen, Netherlands

[73] Assignee: U.S. Philips Corporation, New York, N.Y.

[21] Appl. No.: 419,351

[22] Filed: Sep. 17, 1982

[30] Foreign Application Priority Data

Sep. 25, 1981 [NL] Netherlands ................. 8104414

[51] Int. Cl.⁴ ............... H01L 29/78; H01L 23/48; H01L 23/52
[52] U.S. Cl. .................... 357/51; 353/23.14; 353/65; 353/68
[58] Field of Search ........... 357/23 MG, 65, 71, 68, 357/51

[56] References Cited

U.S. PATENT DOCUMENTS

| 3,427,514 | 2/1969 | Olmstead et al. | 357/23 MG |
| 3,609,412 | 9/1971 | Okumura | 357/23 MG |
| 3,749,985 | 7/1973 | Dawson | 357/23 MG |
| 3,803,461 | 4/1974 | Beneking | 357/23 MG |
| 3,943,286 | 3/1976 | Tsurushima | 357/23 MG |
| 3,999,210 | 12/1976 | Yamada | 357/23 MG |

FOREIGN PATENT DOCUMENTS 0007479 1/1981 Japan ............... 357/23 MG

Primary Examiner—Andrew J. James
Assistant Examiner—Sheila V. Clark
Attorney, Agent, or Firm—Robert T. Mayer; Steven R. Biren

[57] ABSTRACT

A semiconductor device having a semiconductor body includes a field effect transistor and an active transistor region with two electrode zones, one of which surrounds the other, and an island zone which is situated therebetween. These zones enclose channel regions over which there are provided gate electrodes, the first one of which surrounds the second. The gate electrodes are connected to bond pads present outside the active transistor region. The first gate electrode is interrupted at the area of the connection from the second gate electrode to a bond pad, both its ends being connected to another bond pad. Even at very high frequencies, the transistor exhibits a high gain, a high transconductance and a low input attenuation.

5 Claims, 5 Drawing Figures

SEMICONDUCTOR DEVICE HAVING AN IMPROVED DUAL-GATE FIELD EFFECT TRANSISTOR

BACKGROUND OF THE INVENTION

The invention relates to a semiconductor device having a semiconductor body which includes a field effect transistor and which is partly covered with an insulating layer, said semiconductor body comprising an active transistor region with a number of semiconductor zones of the one conductivity type which are embedded in the semiconductor body and which adjoin the surface thereof, said semiconductor zones forming two electrode zones, one of which surrounds the other, and at least one island zone which is situated therebetween, thus enclosing channel regions of the opposite conductivity type. On the insulating layer above the channel regions there are provided gate electrodes, a first gate electrode thereof surrounding a second gate electrode, said gate electrodes being connected respectively to a first and a second bond pad which are provided on the insulating layer, the first bond pad being situated outside the active transistor region.

A semiconductor device of this kind is particularly suitable for use as an amplifier element in high-frequency preamplifiers of television receivers. A signal received by the television antenna is applied to the first gate electrode of the transistor, the second gate electrode being connected to a variable direct voltage source. By variation of the value of the direct voltage on the second gate electrode, the gain of the transistor can be adjusted so that amplified signals have a substantially constant amplitude.

From Netherlands Patent Application No. 6910195, laid open to public inspection, a semiconductor device of the kind set forth is above known in which the gate electrodes form closed loops. The outer loop (the first gate electrode) is connected to the bond pad which is situated outside the active transistor region, the inner loop (the second gate electrode) being locally widened in order to form a bond pad which extends over a part of the island zone which is also locally widened.

A field effect transistor of this kind exhibits a high transconductance and a low input attenuation. The transistor, however, has the drawback that the second bond pad is situated over a part of the island zone. Such a bond pad has a comparatively large surface area, so that a comparatively high capacitance exists between the island zone and the first gate electrode. Due to this capacitance, the gain of the transistor decreases as the frequency of the signal to be amplified becomes higher.

SUMMARY OF THE INVENTION

It is an object of the invention to provide a semiconductor device of the kind set forth above which exhibits a high transconductance and a low input attenuation and in which, moreover, the capacitance between the island zone and the gate electrodes is low. To this end, a semiconductor device of the kind set forth in accordance with the invention is characterized in that the second bond pad is also situated outside the active transistor region, the first gate electrode being interrupted at the area of the connection between the second gate electrode and the second bond pad, both ends of the first gate electrode being connected to the first bond pad.

The capacitance between the second bond pad and the island zone is very low, because the bond pad is situated outside the active transistor region. Moreover, due to the step in accordance with the invention, the transistor exhibits a high transconductance and a low input attenuation.

In general, the transconductance of a transistor becomes higher as the ratio of the length and width of the channel region is made larger. In order to obtain a high transconductance, therefore, a long and narrow channel region is required. This means that the gate electrode present over this channel region must also be long. In a long, narrow gate electrode, the electrical resistance of the electrical material becomes important. Parts of the channel region are then connected to the bond pad via a long part of the gate electrode, i.e. via a comparatively high resistance. This may cause a substantial additional input attenuation, notably for high frequencies. Therefore, it is advantageous for the gate electrode to form a closed loop as in the known transistor, because the resistance measured between the bond pad and the remotest point of the gate electrode, viewed along the gate electrode, amounts to half the resistance between the bond pad and the remotest point of an equally long strip-shaped electrode. It is a drawback of the closed loop, however, that the bond pad of the second gate electrode which is situated within the loop must also be situated inside the loop, as in the known transistor, and hence over an active transistor region, thus causing an undesirable capacitance. In a transistor in accordance with the invention, however, the loop is opened so that the gate electrode situated therein can be connected to the bond pad which is situated outside the active transistor region. In accordance with the invention, both ends of the loop are connected to the first bond pad which is situated outside the active transistor region. Because the connections may be comparatively wide and hence low-ohmic, the loop is electrically closed. The desired combination of favorable properties is thus achieved in a single device.

A preferred embodiment of a semiconductor device in accordance with the invention is characterized in that the connection between the second gate electrode and the second bond pad comprises an auxiliary connection which crosses the connection between the first gate electrode and the first bond pad adjacent the active transistor region and which is insulated from this connection. Consequently, the second bond pad can be situated outside the loop which is formed by the first gate electrode and the connections thereof to the first bond pad. The part of the loop which is situated outside the active transistor region, therefore, may be comparatively small. The high-frequency properties of the device are thus not adversely influenced.

The occurrence of high-frequency oscillations is counteracted by having the auxiliary connection exhibit an electrical resistance of between 5 and 25 ohms.

A semiconductor device in accordance with the invention which has a comparatively flat lay-out is characterized in that the auxiliary connection is a conductor strip which is embedded in the insulating layer provided on the semiconductor body.

This conductor strip is preferably simply formed as a strip of polycrystalline silicon.

BRIEF DESCRIPTION OF THE DRAWING

The invention will be described in detail hereinafter, by way of example, with reference to the drawing. In the drawing.

Figure 1:
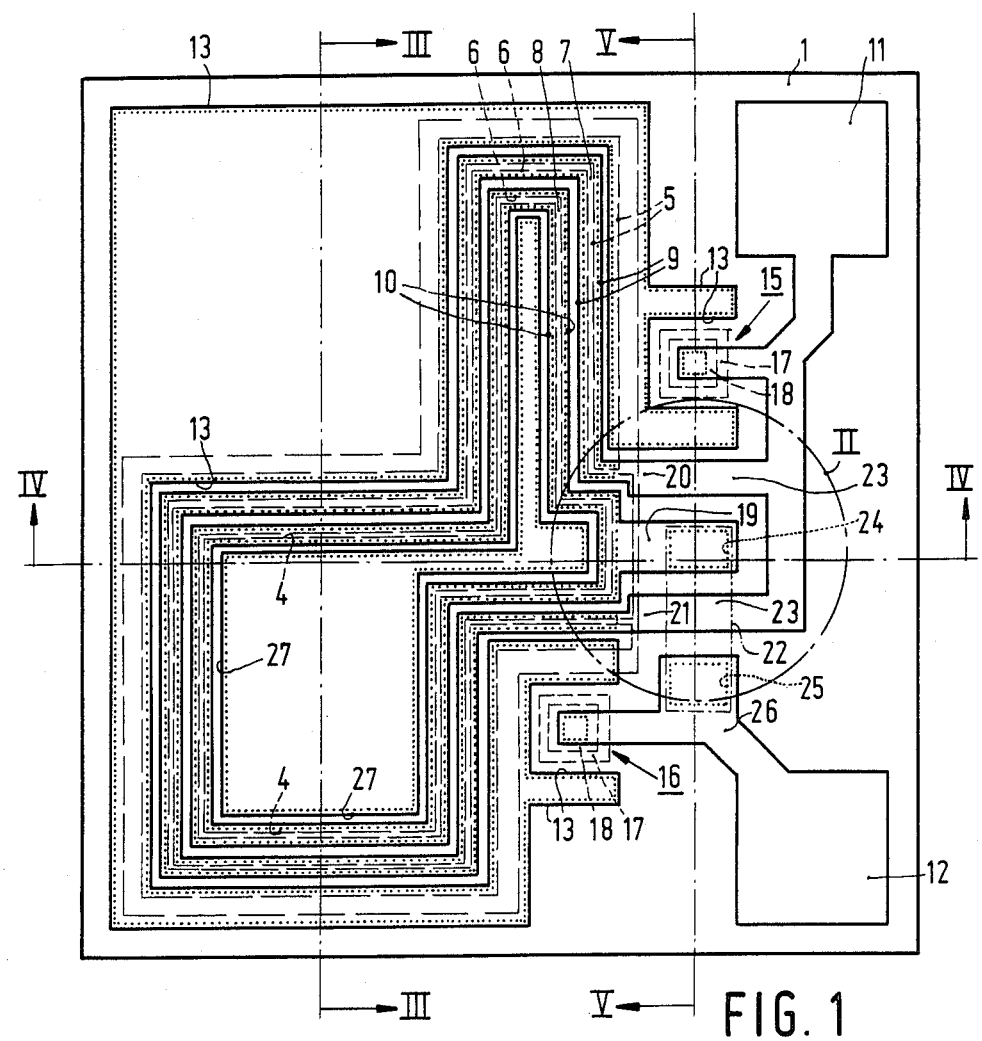
FIG. 1 is a diagrammatic plan view of a semiconductor device in accordance with the invention.

The figures are diagrammatic representations which are not to scale. The dimensions in the thickness direction in the cross-sectional views are highly exaggerated for the sake of clarity. Semiconductor zones of the same conductivity type are shaded in the same direction, and corresponding parts are denoted by corresponding reference numerals in the figures.

DESCRIPTION OF THE PREFERRED EMBODIMENT

Figure 3:
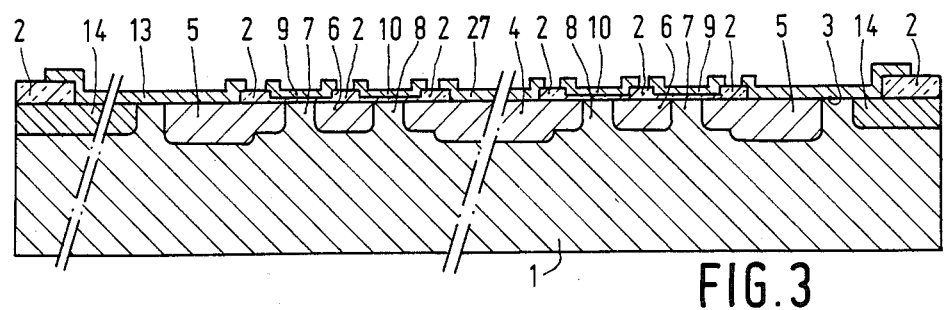
FIG. 3 is a cross-sectional view taken along the line III—III in FIG. 1.
Figure 2:
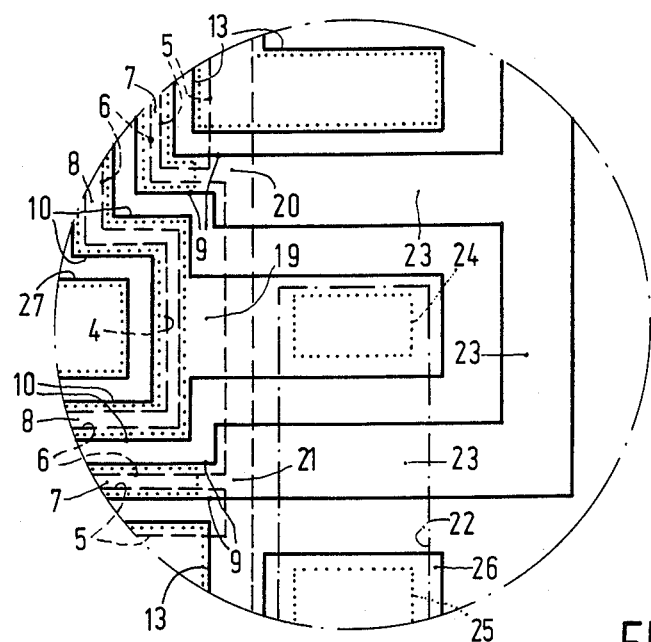
FIG. 2 shows the part which is enclosed by the circle II in FIG. 1 at an increased magnification.
Figure 4:
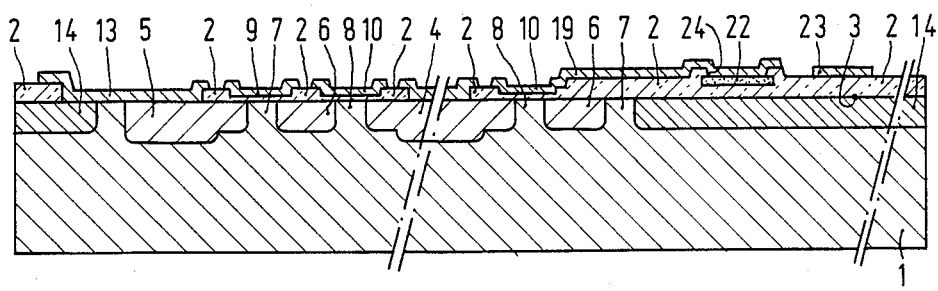
FIG. 4 is a cross-sectional view taken along the line IV—IV in FIG. 1.
Figure 5:
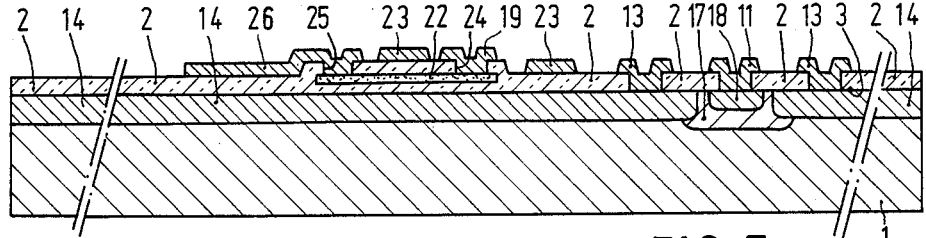
FIG. 5 is a cross-sectional view taken along the line V—V in FIG. 1.

The semiconductor device shown in FIGS. 1 to 5 comprises a semiconductor body 1 with a field effect transistor. The semiconductor body 1 is made of a suitable semiconductor material such as silicon, is partly covered with an insulating layer 2 and comprises an active transistor region with a number of semiconductor zones of the one conductivity type which are embedded in the semiconductor body and which adjoin the surface 3 thereof. These semiconductor zones form two electrode zones 4 and 5 (the drain zone and the source zone, respectively), one of which surrounds the other, and an island zone 6 which is situated therebetween, enclosing channel regions 7 and 8 of the opposite conductivity type. The figures show only one island zone, but this number may alternatively be larger; in that case more than the two channel regions 7 and 8 are enclosed. Over the channel regions 7 and 8, gate electrodes 9 and 10 are provided on an insulating layer 2, the first gate electrode 9 surrounding a second gate electrode 10. The gate electrodes 9 and 10 are connected to a first bond pad 11 and a second bond pad 12, respectively. The electrode zone 4 (the drain zone) is connected to a drain electrode 27, while the electrode zone 5 (the source zone) is connected to a source electrode 13. The active transistor region is also surrounded by a zone 14 of the opposite conductivity type in which there are provided two protection diodes 15 and 16 which are connected between the bond pads 11 and 12 and the source electrode 13. These diodes are formed in the zone 14 by providing therein the zone 17 of the one conductivity type and a zone 18 of the opposite conductivity type. These back-to-back connected diodes 15 and 16 serve to prevent break-down in the field effect transistor.

The first and the second bond pad 11 and 12 are both provided outside the active transistor region, the first gate electrode 9 being interrupted at the area of the connection 19 between the second gate electrode 10 and the second bond pad 12, both ends 20 and 21 of the first gate electrode 9 being connected to the first bond pad 11. Because the bond pads 11 and 12 are situated outside the active transistor region, the occurrence of undesirable capacitances between these electrodes and parts of the active transistor region is strongly counteracted. Notably, the so-called island capacitance (the capacitance between a bond pad of a gate electrode and the island zone) is liable to have a very adverse effect on the gain of the transistor at high frequencies. The present transistor is capable of amplifying signals having a frequency of up to 900 MHz by 22 dB. Because, moreover, both ends 20 and 21 of the first gate electrode 9 are connected to the first bond pad 11, the transistor also exhibits a high transconductance and a low input attenuation. In order to obtain a high, desirable transconductance (approximately 20 mS), the length of the channel region must be approximately 750 times larger than its width. For the gate electrodes 9 and 10, being slightly wider than the channel regions 7 and 8, this means that their length must be approximately 500 times larger than their width. In practice, the resistance of such a comparatively long electrode may amount to as much as 25 ohms, which causes an additional input attenuation, notably at high frequencies. In the case of unilateral inputs to such a long and narrow control electrode, this attenuation is liable to amount to as much as 5 mS at a frequency of 800 MHz. When such a gate electrode is driven at both ends, as in the present transistor, so that the total resistance is reduced to one half, said attenuation amounts to 3 mS. Because the bond pads 11 and 12 of the present transistor are situated outside the active transistor region and because the ends 20 and 21 are both connected to the first bond pad 11, the transistor exhibits a high gain as well as a high transconductance and a low input attenuation even at high frequencies.

The connection between the second gate electrode 10 and the second bond pad 12 comprises an auxiliary connection 22 which crosses the connection between the first gate electrode 9 and the first bond pad 11 outside the active transistor region and which is insulated from this connection. The second bond pad 12 is situated outside the loop which is formed by the first gate electrode 9 and the connections 23 thereof to the first bond pad 11. The part of the loop which is situated outside the active transistor region, therefore, may be comparatively small. This counteracts adverse effects on high-frequency properties. High-frequency oscillations are suppressed when the auxiliary connection 22 forms an electrical resistance of from 5 to 25 ohms, so that the input attenuation on the second gate electrode is increased.

The auxiliary connection 22 is a conductor strip which is embedded in the insulating layer 2 present on the semiconductor body 1 and which is connected, via contact windows 24 and 25, to the connection 19 with the second gate electrode 10 and to the connection 26 with the second bond pad 12. Preferably, the auxiliary connection 22 is formed by a conductor strip of polycrystalline silicon. A simple, comparatively flat lay-out can thus be realized by means of methods customarily used in the semiconductor art.

The entire field effect transistor described can be made of customary materials in a conventional manner. The semiconductor body 1 consists of, for example, monocrystalline p-type silicon having a specific resistance of from 15 to 20 Ohm.cm. The surface 3 thereof is first provided with a layer of silicon oxide having a thickness of approximately 1 $\mu$m on which a strip of polycrystalline silicon having a thickness of approximately 0.6 $\mu$m is deposited in order to form the auxiliary connection 22. In the layer of silicon oxide there are provided windows through which n-type semiconductor zones having a resistance of approximately 10 ohms per square are provided by diffusion of phosphorus in the semiconductor body 1 in order to form the parts of the electrode zones 4 and 5 which are directly contacted by the drain electrode 27 and the source electrode 13. The strip of polycrystalline silicon is also doped during this operation and subsequently exhibits a resistance of from 10 to 15 ohms per square. Subsequently, the silicon oxide over the active transistor region still present adjacent the windows is removed, after which a layer of phosphorus-doped silicon oxide having a thickness of approximately 1 $\mu$m is deposited across the entire substrate, said layer being removed again at the areas where the channel regions 7 and 8 are to be formed. Subsequently, an oxidation treatment is performed at 1050° C. during which a thin oxide layer (gate oxide) having a thickness of approximately 50 nm is formed over the channel regions 7 and 8, the parts of the electrode zones 4 and 5 adjoining the channel regions 7 and 8 and the island zone 6 being formed in the substrate at the same time by diffusion of phosphorus from the silicon oxide. These zones then exhibit a resistance of 1000 ohms per square. The strip of polycrystalline silicon is covered with the layer of silicon oxide having a thickness of approximately 1 $\mu$m. Finally, after the formation of the necessary contact windows, an Al-metallization is deposited in order to form the electrodes 9, 10, 11, 12, 13 and 27 and the necessary connections 23 and 26. The protection diodes 15 and 16 and the so-called channel stopper zone 14 are also formed in a customary manner.

It will be clear that the invention is not restricted to the described embodiment, but that within the scope of the invention many variations are possible to those skilled in the art. For example, the conductivity type of all semiconductor zones and regions can be replaced (at the same time) by the opposite conductivity type. Also, instead of silicon, use can be made of another semiconductor material, for example, germanium or a III-V compound such as gallium arsenide. Instead of silicon oxide use can be made of another insulating layer, for example, a layer made of organic lacquer, and instead of aluminum other metals such as tungsten or chromium can be used for the metallization.

We claim:

1. A semiconductor device comprising a semiconductor body which includes a field effect transistor and which is partly covered with an insulating layer, said semiconductor body comprising an active transistor region with a plurality of semiconductor zones of one conductivity type which are embedded in the semiconductor body and which adjoin the surface thereof, said semiconductor zones forming two electrode zones, one of which surrounds the other, and at least one island zone which is situated therebetween, enclosing channel regions of the opposite conductivity type, at lest first and second gate electrodes provided on the insulating layer above the channel regions, said first gate electrode having two ends and completely surrounding said second gate electrode, said first and second gate electrodes being connected, respectively, to a first and a second bond pad, which bond pads are provided on the insulating layer, the first bond pad being situated outside the active transistor region, the second bond pad also being situated outside the active transistor region, the first gate electrode being interrupted at the location of the connection between the second gate electrode and the second bond pad, said second electrode forming a closed loop and both ends of the first gate electrode being connected to the first bond pad so that said first gate electrode also forms a closed loop.

2. A semiconductor device as claimed in claim 1, characterized in that the connection between the second gate electrode and the second bond pad comprises an auxiliary connection with crosses beneath and which is insulated from the connection between the first gate electrode and the first bond pad adjacent the active transistor region.

3. A semiconductor device as claimed in claim 2, characterized in that the auxiliary connection has an electrical resistance of between 5 and 25 ohms.

4. A semiconductor device as claimed in claim 2 or 3, characterized in that the auxiliary connection is a conductor strip embedded in the insulating layer provided on the semiconductor body.

5. A semiconductor device as claimed in claim 4, characterized in that the conductor strip is a strip of polycrystalline silicon.

* * * * *